US012648402B2

(12) United States Patent
Zhang

(10) Patent No.: US 12,648,402 B2
(45) Date of Patent: Jun. 2, 2026

(54) WAFER PROCESSING DEVICE, SYSTEM AND CONTROL METHOD APPLIED TO WAFER PROCESSING DEVICE

(71) Applicant: SwaySure Technology Co., Ltd., Shenzhen (CN)

(72) Inventor: Peng Zhang, Shenzhen (CN)

(73) Assignee: SWAYSURE TECHNOLOGY CO., LTD., Shenzhen (CN)

( * ) Notice: Subject to any disclaimer, the term of this patent is extended or adjusted under 35 U.S.C. 154(b) by 41 days.

(21) Appl. No.: 19/020,025

(22) Filed: Jan. 14, 2025

(65) Prior Publication Data

US 2025/0316517 A1      Oct. 9, 2025

(30) Foreign Application Priority Data

Apr. 3, 2024      (CN) .......................... 202410407864.9

(51) Int. Cl.
    *H10P 72/30*       (2026.01)
    *G05B 19/418*     (2006.01)
    (Continued)

(52) U.S. Cl.
    CPC ...... *H10P 72/3411* (2026.01); *G05B 19/4189* (2013.01); *H10P 72/0434* (2026.01);
    (Continued)

(58) Field of Classification Search
None
See application file for complete search history.

(56) References Cited

U.S. PATENT DOCUMENTS 5,462,397 A * 10/1995 Iwabuchi ............ H10P 72/3312
                                414/217
6,540,465 B2 * 4/2003 Tometsuka .......... H10P 72/3312
                                414/217

(Continued)

FOREIGN PATENT DOCUMENTS

CN       114613692       6/2022
CN       117276159     12/2023

(Continued)

OTHER PUBLICATIONS

JPO, Decision to Grant a Patent for JP Application No. 2025-012537, Dec. 16, 2025.

(Continued)

*Primary Examiner* — Mark C Hageman
(74) *Attorney, Agent, or Firm* — Hodgson Russ LLP

(57) ABSTRACT

A wafer processing device includes a processing assembly, a wafer boat loading and unloading chamber, a wafer boat base located in the wafer boat loading and unloading chamber, a wafer loading and unloading chamber, a wafer transfer assembly located within the wafer loading and unloading chamber, a plurality of isolation chambers, a plurality of wafer boats, and a transfer device, and a front switching door is provided between the isolation chamber and the wafer boat loading and unloading chamber, and a rear switching door is provided between the isolation chamber and the wafer boat loading and unloading chamber. The transfer device is used to transfer the wafers in the interiors of the wafer loading and unloading chamber and the isolation chamber, and transfer the wafers in the interior of the wafer boat loading and unloading chamber and the isolation chamber.

16 Claims, 5 Drawing Sheets

(51) Int. Cl.
    *H10P 72/00*         (2026.01)
    *H10P 72/76*         (2026.01)

(52) U.S. Cl.
    CPC ...... *H10P 72/3404* (2026.01); *H10P 72/7602*
            (2026.01); *G05B 2219/45031* (2013.01)

(56)                References Cited

U.S. PATENT DOCUMENTS

| | | | |
|---|---|---|---|
| 8,355,808 B2 * | 1/2013 | Inokawa | .......... G05B 19/41875 |
| | | | 700/110 |
| 10,636,681 B2 * | 4/2020 | Kamimura | .......... H10P 72/0402 |
| 11,094,572 B2 * | 8/2021 | Morita | ............... H10P 72/0434 |

FOREIGN PATENT DOCUMENTS

| | | |
|---|---|---|
| JP | H01125821 | 5/1989 |
| JP | H04137613 | 5/1992 |
| JP | 2000021798 | 1/2000 |
| JP | 2002343720 | 11/2002 |
| JP | 2005203458 | 7/2005 |
| JP | 20090118632 | 11/2009 |
| TW | 440905 | 6/2001 |

OTHER PUBLICATIONS

CNIPA, Notification to Grant Patent Right for Invention for CN
Application No. 202410407864.9, Aug. 22, 2025.

* cited by examiner

WAFER PROCESSING DEVICE, SYSTEM AND CONTROL METHOD APPLIED TO WAFER PROCESSING DEVICE

CROSS-REFERENCE TO RELATED APPLICATIONS

This application claims priority to Chinese Patent Application No. 202410407864.9, filed on Apr. 3, 2024, the entire disclosure of which is hereby incorporated herein by reference.

TECHNICAL FIELD

The present application belongs to the field of semiconductor technology, and specifically relates to a wafer processing device, a wafer processing system and a control method applied to the wafer processing device.

BACKGROUND

In the semiconductor manufacturing process, a wafer processing device such as a furnace tube machine is often used to process a large number of wafers at one time, but in the transferring, loading and unloading of wafers, it takes more time, which reduces the production efficiency. In addition, the wafers are easily contaminated in the process of transferring, which reduces the yield of the product.

SUMMARY

There are provided a wafer processing device, a wafer processing system, and a control method applied to the wafer processing device according to embodiments of the present disclosure. The technical solution is as below.

A first aspect of the present application provides a wafer processing device, which includes:

a machining region, comprising at least one machining assembly;

a wafer loading and unloading region, comprising a wafer boat loading and unloading chamber and a wafer transfer assembly provided within the wafer boat loading and unloading chamber, where the wafer transfer assembly is configured to make a to-be-processed wafer within a wafer cassette to be transferred to a wafer boat or to make a processed wafer on the wafer boat to be transferred to the wafer cassette;

a wafer boat loading and unloading region, including a wafer boat loading and unloading chamber and a wafer boat base provided within the wafer boat loading and unloading chamber, where the wafer boat base is configured to carry the wafer boat and to send the wafer boat into or out of the machining assembly;

an isolation region, located between the wafer boat loading and unloading region and the wafer loading and unloading region, and comprising a plurality of mutually independent isolation chambers, where a front switching door is provided between each of the plurality of isolation chambers and the wafer boat loading and unloading chamber, the front switching door is capable of being opened or closed for opening or closing each of the plurality of isolation chambers and the wafer boat loading and unloading chamber, wherein a rear switching door is provided between each of the plurality of isolation chambers and the wafer boat loading and unloading chamber, and is capable of being opened or closed for opening or closing each of the plurality of isolation chambers and the wafer boat loading and unloading chamber; and at least two wafer boats and at least two transfer devices, wherein one of at least two transfer device is configured to transfer the wafer boats between the wafer loading and unloading chamber and an interior of each of the plurality of isolation chambers and another one of at least two transfer device is configured to transfer the wafer boats between the wafer boat loading and unloading chamber and each of the plurality of isolation chambers;

where the plurality of the isolation chambers include a first isolation chamber and a second isolation chamber, and the first isolation chamber is configured to accommodate a wafer boat that is transferred from the wafer loading and unloading chamber to an interior of the first isolation chamber and is loaded with the to-be-processed wafer, and the second isolation chamber is configured to accommodate the wafer boat that is transferred from the wafer boat loading and unloading chamber to an interior of the second isolation chamber and is loaded with the processed wafer.

A second aspect of the present application provides a control method, applied to any one of the wafer processing devices as mentioned above, the method includes:

controlling a rear switching door corresponding to a first isolation chamber to open after the transfer device is controlled to transfer the wafer boat loaded with the processed wafer in the wafer boat loading and unloading chamber to an interior of a second isolation chamber, and then controlling the transfer device to transfer a wafer boat loaded with an unprocessed wafer in the first isolation chamber to a wafer boat base in the wafer boat loading and unloading chamber; and controlling a front switching door corresponding to the second isolation chamber to open after the transfer device is controlled to transfer a wafer boat loaded with the unprocessed wafer in the wafer loading and unloading chamber to an interior of the first isolation chamber, and then controlling the transfer device to transfer the wafer boat loaded with the processed wafer in the second isolation chamber to the wafer loading and unloading chamber.

A third aspect of the present application provides a wafer processing system, which includes:

any one of the wafer processing devices as mentioned above; and a master controller for realizing any one of the control methods as mentioned above.

The technical solutions provided by embodiments of the present application have at least the following advantages:

Other features and advantages of the present application will become apparent by the following detailed description, or will be learned in part by practice of the present application.

It should be understood that the above general description and the detailed description that follows are exemplary and explanatory only and do not limit the present application.

BRIEF DESCRIPTION OF THE DRAWINGS

The accompanying drawings herein are incorporated into and form a part of the specification, illustrate embodiments consistent with the present application, and are used in conjunction with the specification to explain the principles of the present application. It will be apparent that the accompanying drawings in the following description are only some of the embodiments of the present application, and that other accompanying drawings may be obtained from these drawings without creative labor for those skilled in the art.

DETAILED DESCRIPTION OF THE EMBODIMENTS

Figure 1:
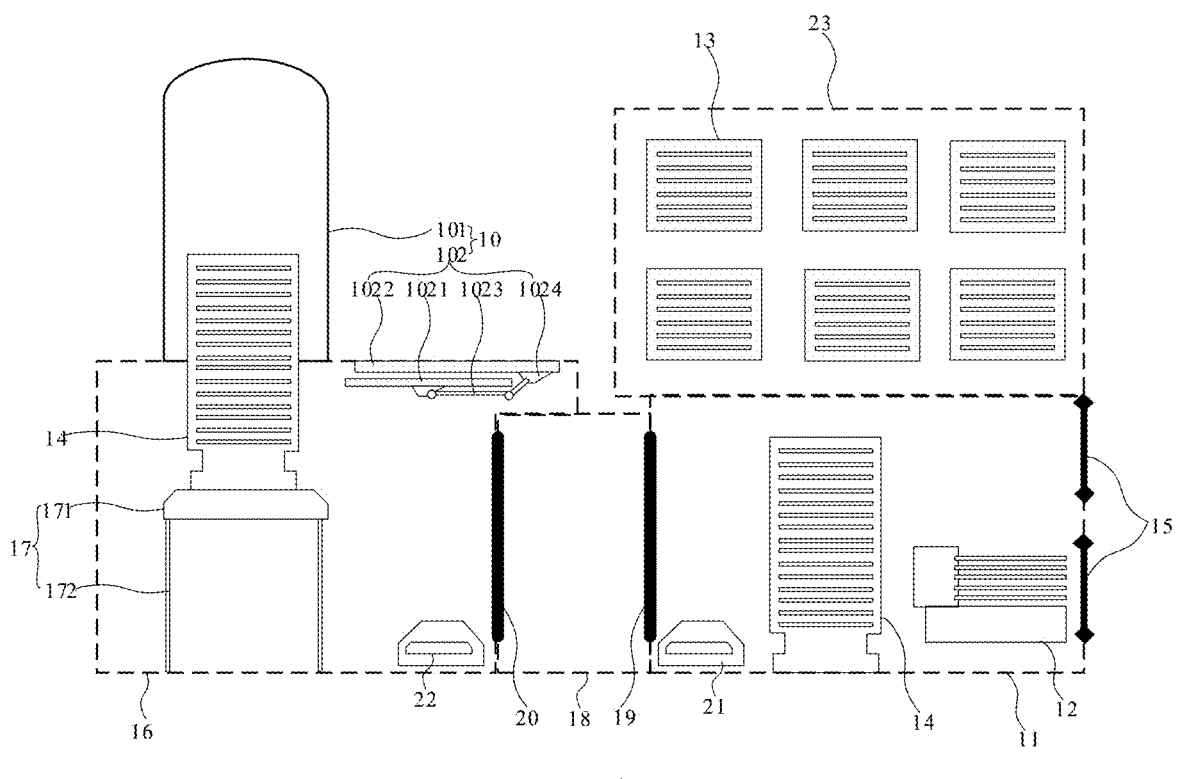
FIG. 1 is a schematic structural diagram of a front view of a wafer processing device described in an embodiment of the present application.

Example embodiments will now be described more fully with reference to the accompanying drawings. However, the example embodiments can be implemented in a variety of forms and should not be construed as being limited to the examples set forth herein; rather, the provision of these embodiments allows for the present application to be more comprehensive and complete and conveys the idea of the example embodiments in a comprehensive manner to those skilled in the art.

In addition, the described features, structures, or characteristics may be combined in one or more embodiments in any suitable manner. In the following description, many specific details are provided thereby giving a full understanding of the embodiments of the present application. However, those skilled in the art will realize that the technical solutions of the present application can be practiced without one or more of the specific details, or other methods, components, devices, steps, etc. can be employed. In other cases, the well-known methods, devices, implementations, or operations are not shown or described in detail to avoid obscuring aspects of the present application.

The present application is described in further detail below in connection with the accompanying drawings and specific embodiments. It should be noted herein that the technical features involved in the various embodiments of the present application described below may be combined with each other as long as they do not constitute a conflict with each other. The embodiments described below by reference to the accompanying drawings are exemplary and are intended to be used to explain the present application and are not to be construed as a limitation of the present application.

Embodiments of the present application provide a wafer processing device, and the wafer processing device may include at least a plurality of processing regions such as a machining region, a wafer boat loading and unloading region, a wafer loading and unloading region, and an isolation region, etc. It is to be noted that structural compositions of each of the processing regions are described in detail in a later section, and will not be repeated herein. In addition, the wafer processing device of an embodiment of the present application may include, in addition to the plurality of processing regions, a wafer boat and a transfer device, and the transfer device may enable the wafer boat to transfer among the wafer loading and unloading region, the isolation region, and the wafer boat loading and unloading region.

A plurality of wafer boats may be set up, for example: two, three, four, and so on, depending on the specific situation. Since the plurality of wafer boats are provided, at least some of the wafer boats may be allowed to operate in different regions of the wafer processing device, for example, when a wafer boat loaded with the to-be-processed wafer is processed in the machining region, another unloaded wafer boat maybe load to-be-processed wafers in the wafer loading and unloading region, or another wafer boat loaded with processed wafers maybe unload the processed wafers in the wafer loading and unloading region, which enables the wafer processing device to process wafers in a batch, and reduces the time spent by the wafer processing device in transferring, loading and unloading wafers, thereby improving the production and processing efficiency of the wafer processing device.

The structure and working principle of the wafer processing device of an embodiment of the present application are described in detail below in conjunction with the accompanying drawings.

Figure 2:
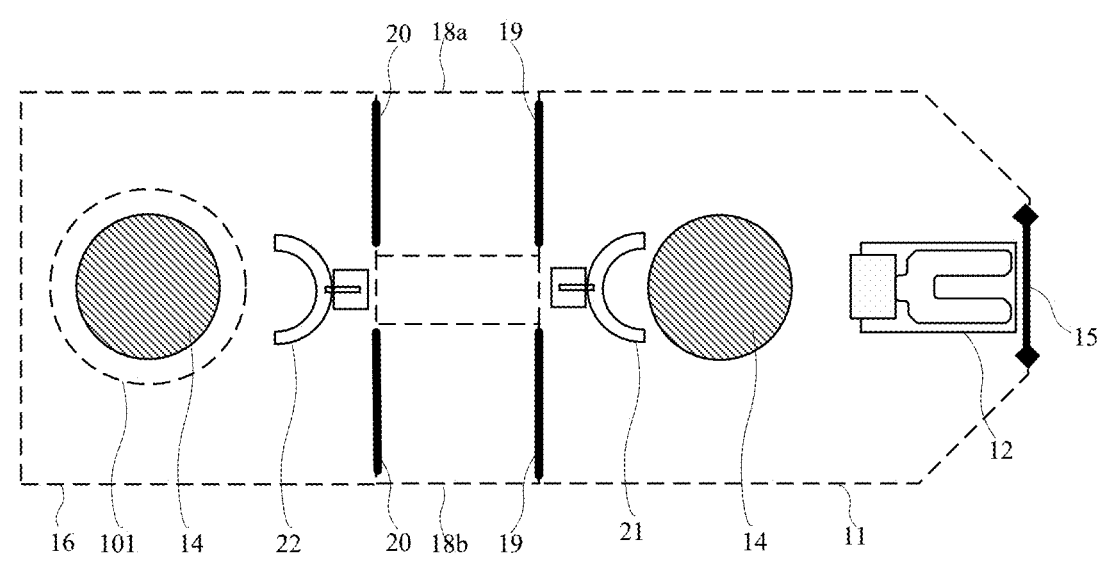
FIG. 2 is a schematic structural diagram of a top view of the wafer processing device described in an embodiment of the present application.

As shown in connection with FIGS. 1 and 2, in embodiments of the present application, the machining region may include at least one machining assembly 10, and the machining assembly 10 may process wafers provided therein.

Combined with FIGS. 1 and 2, in embodiments of the present application, the wafer loading and unloading region may include a wafer loading and unloading chamber 11 and a wafer transfer assembly 12. The wafer transfer assembly 12 is provided in the wafer loading and unloading chamber 11, and the wafer transfer assembly 12 may be used to enable to-be-processed wafers within the wafer cassette 13 to be transferred to the wafer boat 14 or to enable processed wafers on the wafer boat 14 to be transferred to the wafer cassette 13.

As shown in conjunction with FIGS. 1 and 2, in some embodiments, the wafer loading and unloading chamber 11 may be provided with a front-opening interface mechanical standard (FIMS) 15 that is coupled with the wafer cassette 13, and the front-opening interface mechanical standard 15 may be used to open or close between the wafer cassette 13 and the wafer loading and unloading chamber 11. Specifically, the FIMS may be used to secure, blow, open, and close the wafer cassette 13 during processing of the wafer, to ensure that the wafer cassette 13 is sealed from the outside world before and after the opening of the wafer cassette 13 to enable wafers be transferred cleanly between the wafer loading and unloading chamber 11 and the wafer cassette 13.

It should be understood that when the wafer loading and unloading chamber 11 is provided with a front-opening interface mechanical standard 15, the wafer cassette 13 referred to in the present embodiment may be designed as a front opening unified pod (FOUP) that is coupled with the front-opening interface mechanical standard 15, and the front opening unified pod of the present embodiment is a closed container that is mainly used for storing semiconductor wafers, and to protect, transport, and store wafers during the manufacturing process. It provides a high level of cleanliness and protection from contamination and damage to the wafers from the external environment through its closed design.

In addition, it should also be noted that the number of wafer boat loaded in the wafer cassette 13 when it is in the fully loaded state is usually smaller than the number of wafer boat loaded in the wafer boat 14 when it is in the fully loaded state, and thus each wafer boat 14 needs to be matched with a plurality of wafer cassettes 13 when it is in the fully loaded state, or in other words, the plurality of wafer cassettes 13 form a group, and each group is matched with a wafer boat 14.

As shown in FIGS. 1 and 2, the present embodiment may provide a wafer transfer assembly 12 within the wafer loading and unloading chamber 11, and uses the wafer transfer assembly 12 to transfer wafers between the wafer boat 14 and the wafer cassette 13, but is not limited to this, and when there is sufficient space in the wafer loading and unloading chamber 11, the number of the wafer transfer assemblies 12 may be more than one, which improves the loading and unloading efficiency of the wafers.

In an embodiment of the present application, shown in conjunction with FIGS. 1 and 2, the wafer boat loading and unloading region may include a wafer boat loading and unloading chamber 16 and a wafer boat base 17 provided within the wafer boat loading and unloading chamber 16, and the wafer boat base 17 is used to carry the wafer boat 14 and to send the wafer boat 14 into or out of the machining assembly 10. Specifically, the wafer boat base 17 may be used to carry the wafer boat 14 loaded with to-be-processed wafers and send the wafer boat 14 loaded with to-be-processed wafers into the machining assembly. The wafer boat 14 are sent into the machining assembly 10 for processing, and after processing, the wafer boat base 17 may carry the wafer boat 14 loaded with processed wafers and send the wafer boat 14 loaded with processed wafers out of the machining assembly 10.

Referring to FIGS. 1 and 2, an isolation region is located between the wafer boat loading and unloading region and the wafer loading and unloading region, and the isolation region may include a plurality of mutually independent isolation chambers 18.

A front switching door 19 is provided between each isolation chamber 18 and the wafer loading and unloading chamber 11, and the front switching door 19 can be opened or closed to open or close between the isolation chamber 18 and the wafer loading and unloading chamber 11, that is to say, when the front switching door 19 is in an open state, the isolation chamber 18 and the wafer loading and unloading chamber 11 are opened, so that the transfer device can make the wafer boat 14 to transfer within the isolation chamber 18 and the wafer loading and unloading chamber 11. The isolation chamber 18 and the wafer loading and unloading chamber 11 are closed when the front switching door 19 is in the closed state, such that the isolation chamber 18 is in a sealed state with respect to the wafer loading and unloading chamber 11 in order to avoid or improve mutual contamination between the isolation chamber 18 and the wafer loading and unloading chamber 11.

In addition, a rear switching door 20 is provided between each isolation chamber 18 and the wafer boat loading and unloading chamber 16, and the rear switching door 20 can be opened or closed to open or close between the isolation chamber 18 and the wafer boat loading and unloading chamber 16, i.e., the isolation chamber 18 and the wafer boat loading and unloading chamber 16 are opened when the rear switching door 20 is in the open state, such that the transfer device allows the wafer boat 14 to be transferred within the isolation chamber 18 and the wafer boat loading and unloading chamber 16, and the isolation chamber 18 and the wafer boat loading and unloading chamber 16 are closed when the rear switching door 20 is in the closed state, such that the isolation chamber 18 is in a sealed state with respect to the wafer boat loading and unloading chamber 16 in order to avoid or improve mutual contamination between the isolation chamber 18 and the wafer boat loading and unloading chamber 16.

In embodiments of the present application, as shown with reference to FIG. 2, the plurality of isolation chambers 18 may include a first isolation chamber 18a and a second isolation chamber 18b, the first isolation chamber 18a is configured to accommodate a wafer boat 14 that is transferred from the wafer loading and unloading chamber 11 to an interior of the first isolation chamber 18a and is loaded with the to-be-processed wafer, and the second isolation chamber 18b is configured to accommodate the wafer boat 14 that is transferred from the wafer boat loading and unloading chamber 16 to an interior of the second isolation chamber 18b and is loaded with the processed wafer, such design not only enables the wafer boat 14 loaded with the to-be-processed wafer and the wafer boat 14 loaded with processed wafers to be located in different chambers, but also enables the chambers that are passed through by the wafer boat 14 loaded with the to-be-processed wafer in the transfer process have different from chambers that are passed through by the wafer boat 14 loaded with the processed wafer in the transfer process, for example, the transferring route of the wafer boat 14 loaded with to-be-processed wafer is from the wafer loading and unloading chamber 11→the first isolation chamber 18a→the wafer boat loading and unloading chamber 16→the machining assembly 10, the transferring route of the wafer boat 14 loaded with the processed wafer is from the machining assembly 10→the wafer boat loading and unloading chamber 16→the second isolation chamber 18b→the wafer loading and unloading chamber 11, that is, isolation chambers 18 passed through in the transferring route of the wafer boat 14 loaded with to-be-processed wafer are different from isolation chambers 18 passed through in the transferring route of the wafer boat 14 loaded with the processed wafer. Compared with the solution that the wafer boat 14 loaded with to-be-processed wafer and the wafer boat 14 loaded with the processed wafer are located in the same isolation chamber and pass through the same isolation chambers. This embodiment can avoid or improve that reaction by-products carried on the wafer boat 14 loaded with the processed wafer are diffused to the wafer that is going to be machined (the to-be-processed wafer).

In addition, during the process of moving the wafer boat 14 loaded with the processed wafer out of the machining assembly 10: another wafer boat 14 loaded with the to-be-processed wafer can be sealed in the first isolation chamber 18a for waiting, i.e.: another wafer boat 14 loaded with the to-be-processed wafer can be located in the first isolation chamber 18a, and the rear switching door 20 between the first isolation chamber 18a and the wafer boat loading and unloading chamber 16 is in the closed state. Compared with the solution that another wafer boat 14 loaded with unprocessed wafers is transferred to the wafer boat loading and unloading chamber 16 for waiting, this embodiment avoids a situation in which reaction by-products within the machining assembly 10 are sprayed onto the to-be-processed wafers to contaminating the to-be-processed wafers.

It should be understood that in the process of moving the wafer boat 14 loaded with processed wafers out of the machining assembly 10, it is not limited to enclosing another wafer boat 14 loaded with to-be-processed wafers in the first isolation chamber 18a for waiting, but also another wafer boat 14 loaded with to-be-processed wafers may be enclosed in the wafer loading and unloading chamber 11 for waiting, which may be regulated according to the actual situation.

In some embodiments, as shown with reference to FIGS. 1 and 2, the machining assembly 10 may include a machining furnace tube 101, the machining furnace tube 101 is provided outside the wafer boat loading and unloading chamber 16 and in communication with the wafer boat loading and unloading chamber 16, the machining furnace tube 101 is used to hold the wafer boat 14 and is able to provide a desired working environment for processing wafers on the wafer boat 14. It should be understood that the machining assembly 10 of an embodiment of the present application may include, in addition to the machining furnace tube 101 for accommodating the wafer boat 14, a gas supply device (not shown), etc. A reaction gas may be provided by the gas supply device to the machining furnace tube 101 for processing wafers located within the machining furnace tube 101.

Exemplarily, the machining furnace tube 101 may be a vertical furnace tube, and a tube opening of the machining furnace tube 101 is provided opposite to the top of the wafer boat loading and unloading chamber 16, in other words, the machining furnace tube 101 may be provided at the top of the wafer boat loading and unloading chamber 16, and the top of the wafer boat loading and unloading chamber 16 is provided with a through opening that matches with the tube opening of the machining furnace tube 101, so as to enable an interior of the machining furnace tube 101 to be in communication with an interior of the wafer boat loading and unloading chamber 16. As shown with reference to FIG. 1, the wafer boat base 17 may include a base body 171 and a lifting assembly 172, and an orthographic projection of the tube opening of the machining furnace tube 101 is located within the base body 171, and the lifting assembly 172 is connected to the base body 171 for driving the base body 171 to carry out lifting and lowering motions to close or open the machining furnace tube 101, so as to realize that the wafer boat 14 carried on the base body 171 is sent into the machining furnace tube 101 or is sent out of the machining furnace tube 101.

Since an orthographic projection of the tube opening of the machining furnace tube 101 is located within the base body 171, after the lifting assembly 172 drives the base body 171 to rise to completely send the wafer boat 14 carried on the base body 171 into the machining furnace tube 101, the base body 171 can enclose the tube opening of the machining furnace tube 101, so that the machining furnace tube 101 is in a sealed state, which not only provides a clean working environment for wafer machining, and but also improves the efficiency of wafer heat treatment.

In addition, in this embodiment, by adopting a vertical furnace tube cooperating with the vertical lifting type wafer boat base 17, while sending the wafer boat 14 into or out of the machining furnace tube 101, the floor area of the wafer processing device can also be reduced to adapt to more production workshops.

In embodiments of the present application, with reference to FIG. 1, the machining assembly 10 may further include a furnace tube cover 102, the furnace tube cover 102 is provided on the top of the wafer boat loading and unloading chamber 16 and inside the wafer boat loading and unloading chamber 16, and can be movable with respect to the machining furnace tube 101 to open or close the machining furnace tube 101. The furnace tube cover 102 is capable of closing the machining furnace tube 101 when the machining furnace tube 101 is in the pending working state, to avoid contaminant in the wafer boat loading and unloading chamber 16 from diffusing to the machining furnace tube 101, thereby avoiding contaminating the wafers subsequently processed by the machining furnace tube 101, the quality of products is improved.

In addition, when the machining furnace tube 101 is in the working state, the furnace tube cover 102 can open the machining furnace tube 101, at this time, the lifting assembly 172 can drive the base body 171 to rise, so that the wafer boat 14 carried on the base body 171 is completely sent into the machining furnace tube 101, so as to realize the processing of wafers.

In some optional embodiments, the furnace tube cover 102 may include a cover plate 1021, a slide rail 1022, and a connection rod 1023 connecting the cover plate 1021 and the slide rail 1022, and the connection rod 1023 is also used to support the cover plate 1021. The slide rail 1022 is fixed to the top of the wafer boat loading and unloading chamber 16. One end of the connection rod 1023 is fixed to the cover plate 1021, and another end of the connection rod 1023 is provided with a slider 1024, the slider 1024 is slidably connected to the slide rail 1022, and the slider 1024 slides horizontally on the slide rail 1022 to drive the cover plate 1021 closer to or further away from the machining furnace tube 101, so as to close or open the machining furnace tube 101.

In this embodiment, since the furnace tube cover 102 is provided at the top of the wafer boat loading and unloading chamber 16 and a horizontal driving method is adopted to drive the cover plate 1021, on the one hand, it is possible to shorten the movement path of the cover plate 1021 when opening or closing the machining furnace tube 101, and to reduce the difficulty of driving, and on the other hand, it is possible to avoid the interference between the furnace tube cover 102 and the wafer boat base 17 during movement.

In some embodiments, when the machining furnace tube 101 needs to be in the working state, the cover plate 1021 of the furnace tube cover 102 may be opened during the process of driving the base body 171 of the wafer boat base 17 to rise, for example, after the wafer boat 14 loaded with unprocessed wafers is transferred to the base body 171, the lifting assembly 172 may be utilized to drive the base body 171 to rise, so as to make the base body 171 move vertically in a direction close to the machining furnace tube 101. Before the wafer boat 14 is going to enter the machining furnace tube 101, the slider 1024 may be driven to move horizontally in a direction away from the machining furnace tube 101 to drive the cover plate 1021 to move in a direction away from the machining furnace tube 101, to open the machining furnace tube 101, such that it facilitates subsequently the wafer boat base 17 to send the wafer boat 14 into the machining furnace tube 101, such design can reduce the time of exposure of the interior of the machining furnace tube 101, thereby reducing the contamination of the interior of the machining furnace tube 101.

It should be noted that in the process of driving the cover plate 1021 to move in a direction away from the machining furnace tube 101 to realize that in process of opening the machining furnace tube 101, the lifting assembly 172 can still synchronously drive the base body 171 to rise without having to stop and wait, to improve the processing efficiency of the wafer processing device.

However, it should be understood that in some other embodiments, the cover plate 1021 may also be driven to move in a direction away from the machining furnace tube 101 first, to completely open the machining furnace tube 101, and then the base body 171 is driven to rise, so as to send the wafer boat 14 carried on the base body 171 into the machining furnace tube 101, and the specific embodiment adopted may be determined on a case-by-case basis.

In addition, when the machining furnace tube 101 needs to be in the pending working state, the base body 171 of the wafer boat base 17 may be driven to descend first to completely send the wafer boat 14 carried on the base body 171 out of the machining furnace tube 101, and then the cover plate 1021 may be driven to move in a direction close to the machining furnace tube 101 to close the machining furnace tube 101.

Exemplarily, a plurality of the aforementioned machining assemblies 10 and a plurality of the wafer boat bases 17 may be provided, and each wafer boat base 17 corresponds to the machining assembly 10 to form a group, and by providing a plurality of groups of the machining assemblies 10 and wafer boat bases 17 cooperated with each other, the to-be-processed wafers on the plurality of wafer boats 14 may be machined and processed synchronously, so as to improve the processing efficiency of the wafer processing device. Combining with FIG. 1 and FIG. 3 for another illustration, during the process of one wafer boat 14 loaded with the to-be-processed wafer being sent by one wafer boat base 17 to the corresponding machining assembly 10 for processing, another wafer boat 14 loaded with the to-be-processed wafer may be sent by another wafer boat base 17 to the corresponding machining assembly 10 for processing, which can improve the production tempo of the entire wafer processing device.

Figure 3:
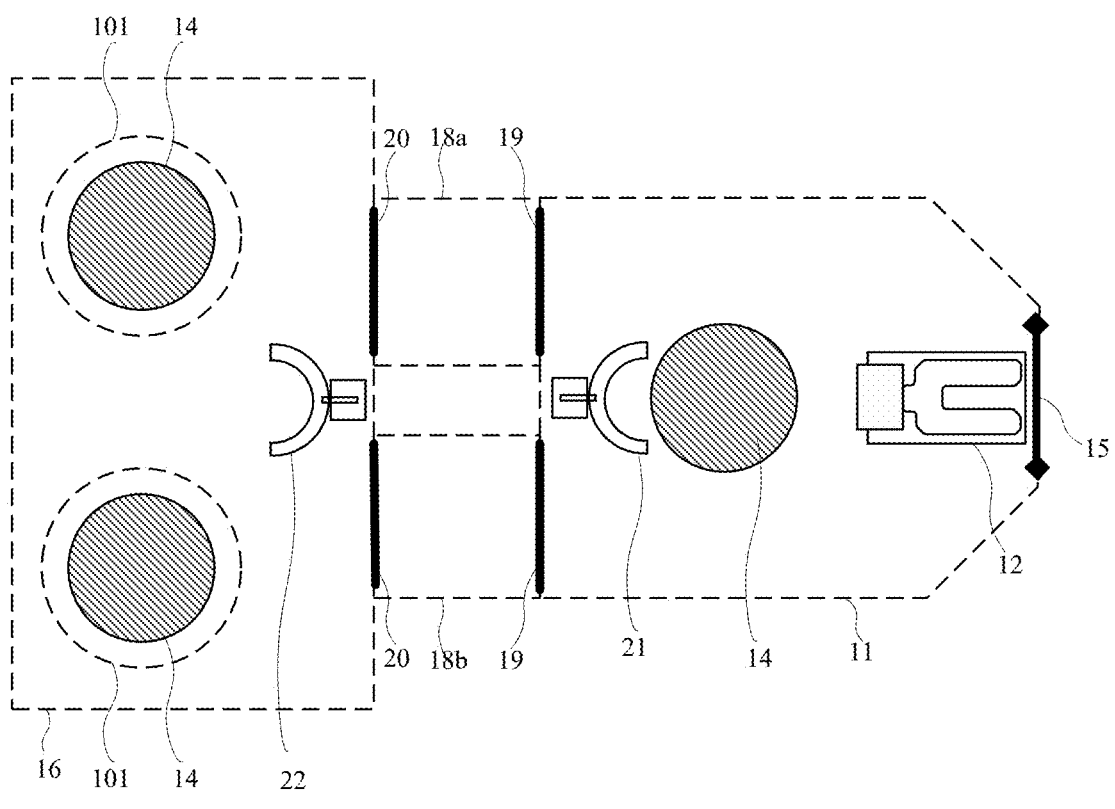
FIG. 3 is a schematic structural diagram of a top view of the wafer processing device described in another embodiment of the present application.

The machining assembly 10 and the wafer boat base 17 in this embodiment are not limited to two shown in FIG. 3, but may also be three, four, etc., depending on the actual situation. In this embodiment, the number of wafer boats 14 may be at least one more than the number of the machining assemblies 10 and the wafer boat bases 17, for example, when one group of the machining assembly 10 and the wafer boat base 17 shown in FIG. 1 and FIG. 2 are set up, the number of wafer boats 14 may be two, but is not limited to this, and more may be set up. When two groups of the machining assemblies 10 and the wafer boat bases 17 shown in FIG. 3 are set up, the number of wafer boats 14 may be three, but is not limited to this, and more may be set up, so that during the working process of the wafer processing device, it can be ensured that the steps of loading and unloading, transferring, and machining are more closely connected, so as to reduce the idle time of each machining assembly 10 and each chamber, so that the production efficiency of the wafer processing device can be improved.

In embodiments of the present application, when the wafers on the wafer boat 14 are completely machined within the machining assembly 10, the wafer boat base 17 needs to send the wafer boat 14 loaded with processed wafers out of the machining assembly 10, and in order to reduce the generation and diffusion of by-product particles in the sending out process, the air pressure within the machining assembly 10 may be made equal to or greater than the air pressure within the wafer boat loading and unloading chamber 16.

Further, the air pressure within the wafer boat loading and unloading chamber 16 may be less than atmospheric pressure, so that the wafer boat loading and unloading chamber 16 is formed as a negative pressure chamber, so as to reduce the entry of dust particles from the outside into the wafer boat loading and unloading chamber 16, thereby reducing the amount of dust particles and other pollutants in the wafer boat loading and unloading chamber 16, and also reducing the diffusion of dust particles and other pollutants in the wafer boat loading and unloading chamber 16 to other regions, to reduce the cross-contamination situation, the overall process is improved.

It should be understood that, because the wafer loading and unloading chamber 11 of this embodiment is provided in the upstream of the wafer boat loading and unloading chamber 16, i.e., in the working process of the wafer processing device, first unprocessed wafers are loaded on the wafer boat 14 in the wafer loading and unloading chamber 11, and then the wafer boat 14 loaded with unprocessed wafers is transferred to the wafer boat loading and unloading chamber 16. Therefore, the wafer loading and unloading chamber 11 is easier to be in communication with the external atmospheric environment than the wafer boat loading and unloading chamber 16, based on this, the present embodiment designs the air pressure within the wafer loading and unloading chamber 11 to be greater than the air pressure within the wafer boat loading and unloading chamber 16, so as to avoid the wafer from being damaged, during the wafer transfer process, caused by the excessively large difference between air pressures of the wafer loading and unloading chamber 11 and the external atmospheric environment.

Exemplarily, the air pressure within the wafer loading and unloading chamber 11 may be atmospheric pressure, that is, the air pressure within the wafer loading and unloading chamber 11 may be equal to the air pressure of the outside atmospheric environment, so that there is no need to set up a pressure regulation assembly within the wafer loading and unloading chamber 11, and thus the cost of the wafer processing device may be reduced.

In other embodiments, the air pressure within the wafer loading and unloading chamber 11 may also be slightly less than the atmospheric pressure, so that a negative pressure is formed within the wafer loading and unloading chamber 11, which may reduce the entry of dust particles from the outside world into the wafer loading and unloading chamber 11, thereby reducing the content of the pollutants, such as dust particles and other pollutants, within the wafer loading and unloading chamber 11.

Since the air pressure within the wafer loading and unloading chamber 11 on the front side of the isolation chamber 18 is different from the air pressure within the wafer boat loading and unloading chamber 16 on the rear side of the isolation chamber 18, in order to balance the air pressure between the isolation chamber 18 and the loading and unloading chambers on the front and rear sides thereof, the present embodiment may also be provided with a pressure regulation assembly (not shown) in the isolation region, which may be used to regulate the air pressure within the isolation chamber 18. Specifically, before controlling the front switching door 19 to open to make the isolation chamber 18 and the wafer loading and unloading chamber 11 to be in an open state, the pressure regulation assembly of the present embodiment may be used to regulate the air pressure within the isolation chamber 18 to be the same as the air pressure within the wafer loading and unloading chamber 11, avoiding convection currents caused by the difference between the air pressure within the isolation chamber 18 and the air pressure within the wafer loading and unloading chamber 11 when the front switching door 19 is opened, because the suction force formed by the convection currents will cause damage to the wafers on the wafer boat 14. Before controlling the rear switching door 20 to open to make the isolation chamber 18 and the wafer boat loading and unloading chamber 16 to be in the open state, the pressure regulation assembly may be used to regulate the air pressure within the isolation chamber 18 to be the same as the air pressure within the wafer boat loading and unloading chamber 16, avoiding convection currents caused by the difference between the air pressure within the isolation chamber 18 and the air pressure within the wafer boat loading and unloading chamber 16 when the rear switching door 20 is opened, because the suction force formed by the convection currents will cause damage to the wafers on the wafer boat 14.

In this embodiment, the air pressure within the first isolation chamber 18a and the air pressure within the second isolation chamber 18b may be independently controlled by the pressure regulation assembly, e.g., the pressure regulation assembly may include a first pressure regulation device and a second pressure regulation device that are independently controlled of each other, the first pressure regulation device may be coupled with the first isolation chamber 18a for individually regulating the air pressure within the first isolation chamber 18a, and the second pressure regulation device may be coupled with the second isolation chamber 18b for individually regulating the air pressure within the second isolation chamber 18b, such design can avoid a situation in which the air pressure within the first isolation chamber 18a and the air pressure within the second isolation chamber 18b conflict with the actual work process during the transferring of the wafer boat 14, so that the wafer processing device can match a variety of situations of the transferring of the wafer boat 14.

For example, if during the process of transferring the wafer boat 14 loaded with unprocessed wafers from the wafer loading and unloading chamber 11 to the first isolation chamber 18a, the wafer boat 14 loaded with processed wafers are also transferred from the wafer boat loading and unloading chamber 16 to the second isolation chamber 18b, the first pressure regulation device can be utilized to regulate the air pressure within the first isolation chamber 18a to be the same as the air pressure within the wafer loading and unloading chamber 11 before the front switching door 19 of the first isolation chamber 18a is opened, and the second pressure regulation device can be utilized to regulate the air pressure within the second isolation chamber 18b to be the same as the air pressure within the wafer boat loading and unloading chamber 16 before the rear switching door 20 of the second isolation chamber 18b is opened. If during the process of transferring the wafer boat 14 loaded with unprocessed wafers from the first isolation chamber 18a to the wafer boat loading and unloading chamber 16, the wafer boat 14 loaded with processed wafers are also transferred from the second isolation chamber 18b to the wafer loading and unloading chamber 11 at the same time, the first pressure regulation device can be utilized to regulate the air pressure within the first isolation chamber 18a to be the same as the air pressure within the wafer boat loading and unloading chamber 16 before the rear switching door 20 of the first isolation chamber 18a is opened, and the second pressure regulation device can be utilized to regulate the air pressure within the second isolation chamber 18b to be the same as the air pressure within the wafer loading and unloading chamber 11 before the front switching door 19 of the second isolation chamber 18b is opened.

It should be understood that the air pressure within the first isolation chamber 18a and the air pressure within the second isolation chamber 18b may also be controlled synchronously by the pressure regulation assembly, i.e., the air pressure within the first isolation chamber 18a and the air pressure within the second isolation chamber 18b are always the same, but if the synchronized pressure regulation is used, it is necessary to avoid the front switching door 19 of the first isolation chamber 18a and the rear switching door 20 of the second isolation chamber 18b from being opened simultaneously in the transfer process, or avoid the rear switching door 20 of the first isolation chamber 18a and the front switching door 19 of the second isolation chamber 18b from being opened simultaneously in the transfer process, so as to avoid convection currents caused by the difference between the air pressure within the isolation chamber 18 and the air pressure within the loading and unloading chamber at the corresponding opened side, because the suction force formed by the convection currents will cause damage to the wafers on the wafer boat 14.

In addition, it should also be noted that before regulating the air pressure within the isolation chamber 18, the front and rear switching doors 20 corresponding to the isolation chamber 18 need to be in the closed state, thereby making the isolation chamber 18 in the closed state, so as to facilitate the regulation of the air pressure within the isolation chamber 18.

In some embodiments of the present application, as shown in FIGS. 1 to 3, the transfer device may include a first transfer robot arm 21 and a second transfer robot arm 22, the first transfer robot arm 21 may be provided in the wafer loading and unloading chamber 11, and the second transfer robot arm 22 may be provided in the wafer boat loading and unloading chamber 16, and since each of the loading and unloading chambers is provided with a transfer robot arm, while the wafer boat 14 is transferred, the operation is made more conveniently and flexibly.

In this embodiment, the first transfer robot arm 21 is used to transfer the wafer boat 14 loaded with to-be-processed wafers in the wafer loading and unloading chamber 11 to the first isolation chamber 18a when the first isolation chamber 18a and the wafer loading and unloading chamber 11 are in the open state. In addition, the first transfer robot arm 21 is also used to transfer the wafer boat 14 loaded with processed wafers in the second isolation chamber 18b to the wafer loading and unloading chamber 11 when the second isolation chamber 18b and the wafer loading and unloading chamber 11 are in the open state. The second transfer robot arm 22 is provided in the wafer boat loading and unloading chamber 16, and the second transfer robot arm 22 is used to transfer the wafer boat 14 loaded with to-be-processed wafers in the first isolation chamber 18a to the wafer boat loading and unloading chamber 16 when the first isolation chamber 18a and the wafer boat loading and unloading chamber 16 are in the open state, and specifically to the wafer boat base 17 in the wafer boat loading and unloading chamber 16. In addition, the second transfer robot arm 22 is used to transfer the wafer boat 14 loaded with processed wafers in the wafer boat loading and unloading chamber 16 to the second isolation chamber 18b when the second isolation chamber 18b and the wafer boat loading and unloading chamber 16 are in the open state, and specifically the wafer boat 14 loaded with processed wafers in the wafer boat base 17 is transferred to the second isolation chamber 18b.

In some embodiments of the present application, as shown with reference to FIG. 1, the wafer processing device may include, in addition to the previously mentioned wafer loading and unloading region, the wafer boat loading and unloading region, the machining region, and the isolation region and other processing regions, and also includes a temporary storage region, which is used to temporarily store a plurality of wafer cassettes 13. It should be noted that the plurality of wafer cassettes 13 stored temporarily in the temporary storage region of the present embodiment may include the wafer cassettes 13 accommodating unprocessed wafers, or may include the wafer cassettes 13 accommodating processed wafers.

With reference to FIG. 1, the temporary storage region of the present embodiment may include a temporary storage chamber 23 accommodating the wafer cassettes 13, but is not limited thereto, and may also include other mechanical assemblies, such as a holder for storing the wafer cassettes 13, a transfer robot arm for transferring the wafer cassettes 13 to a designated location, etc., without being limited herein.

In addition, referring to FIG. 1, the wafer loading and unloading region of the present embodiment is closer to the temporary storage region than the wafer boat loading and unloading region, to be able to shorten the transferring path of the wafer cassette 13 and improve the transferring efficiency.

Based on the wafer processing device described in any of the foregoing embodiments, the embodiment of the present application also provides a control method, and the control method may include at least step S100 and step S102. The control method of the embodiment of the present application is described below in conjunction with FIGS. 1 to 2.

In step S100: after controlling the transfer device to transfer the wafer boat 14 loaded with processed wafers in the wafer boat loading and unloading chamber 16 to the interior of the second isolation chamber 18*b*, the rear switching door 20 corresponding to the first isolation chamber 18*a* is first controlled to be opened, and then the transfer device is controlled to transfer the wafer boat 14 loaded with unprocessed wafers in the first isolation chamber 18*a* to the wafer boat base 17 of the wafer boat loading and unloading chamber 16, to wait for subsequent processing, such operation can avoid the situation that the wafer boat loaded with unprocessed wafers and the wafer boat loaded with processed wafers are located in the same wafer boat loading and unloading chamber 16, and thus can improve the situation where by-products carried on the wafer boat loaded with processed wafers are diffused to the unprocessed wafers.

In some embodiments, after controlling the transfer device to transfer the wafer boat 14 loaded with processed wafers in the wafer boat loading and unloading chamber 16 to the interior of the second isolation chamber 18*b*, and before controlling the rear switching door 20 corresponding to the first isolation chamber 18*a* to open, the rear switching door 20 corresponding to the second isolation chamber 18*b* is controlled to be in the closed state, so that the first isolation chamber 18*a* and the second isolation chamber 18*b* can be in the closed state at the rear switching door 20, to avoid by-products carried on the wafer boat 14 loaded with processed wafers in the second isolation chamber 18*b* from diffusing from the rear switching door 20 to the unprocessed wafers in the first isolation chamber 18*a*.

It is to be noted that after controlling the transfer device to transfer the wafer boat 14 loaded with processed wafers in the wafer boat loading and unloading chamber 16 to the interior of the second isolation chamber 18*b*, and before controlling the rear switching door 20 corresponding to the first isolation chamber 18*a* to open, in addition to controlling the rear switching door 20 corresponding to the second isolation chamber 18*b* to be in the closed state, it is possible to control the front switching door 19 corresponding to the first isolation chamber 18*a* and the second isolation chamber 18*b* to be in the closed state, so as to avoid by-products carried on the wafer boat 14 loaded with processed wafers in the second isolation chamber 18*b* from diffusing from the front switching door 19 to the unprocessed wafers in the first isolation chamber 18*a* or to the unprocessed wafers in the wafer loading and unloading chamber 11.

In step S102, after controlling the transfer device to transfer the wafer boat loaded with unprocessed wafers in the wafer loading and unloading chamber 11 to the interior of the first isolation chamber 18*a*, the front switching door 19 corresponding to the second isolation chamber 18*b* is first controlled to open, and then the transfer device is controlled to transfer the wafer boat loaded with processed wafers in the second isolation chamber 18*b* to the wafer loading and unloading chamber 11 to wait for the subsequent unloading treatment of the processed wafers, such operation can avoid the situation where the wafer boat 14 loaded with unprocessed wafers and the wafer boat 14 loaded with processed wafers are located in the same wafer loading and unloading chamber 11, and thus can improve the situation where by-products carried on the wafer boat 14 loaded with processed wafers are diffused to the unprocessed wafers.

In some embodiments, after controlling the transfer device to transfer the wafer boat 14 loaded with to-be-processed wafers in the wafer loading and unloading chamber 11 to the interior of the first isolation chamber 18*a*, and before controlling the front switching door 19 corresponding to the second isolation chamber 18*b* to open, the front switching door 19 corresponding to the first isolation chamber 18*a* is controlled to be in the closed state, such that the first isolation chamber 18*a* and the second isolation chamber 18*b* can be in the closed state at the front switching door 19, so as to avoid by-products carried on the wafer boat 14 loaded with processed wafers in the second isolation chamber 18*b* from diffusing from the front switching door 19 to the unprocessed wafers in the first isolation chamber 18*a*.

It is to be noted that after controlling the transfer device to transfer the wafer boat 14 loaded with to-be-processed wafers in the wafer loading and unloading chamber 11 to the interior of the first isolation chamber 18*a*, and before controlling the front switching door 19 corresponding to the second isolation chamber 18*b* to open, in addition to controlling the front switching door 19 corresponding to the first isolation chamber 18*a* to be in the closed state, the rear switching door 20 corresponding to the first isolation chamber 18*a* and the second isolation chamber 18*b* can be controlled to be in the closed state, so as to avoid by-products carried on the wafer boat 14 loaded with processed wafers in the second isolation chamber 18*b* from diffusing from the rear switching door 20 to the unprocessed wafers in the first isolation chamber 18*a*.

It is mentioned in the foregoing embodiment that the air pressure within the wafer loading and unloading chamber 11 on the front side of the isolation chamber 18 is different from the air pressure within the wafer boat loading and unloading chamber 16 on the rear side of the isolation chamber 18, and therefore, before opening the switching doors on the front and rear side of the isolation chamber 18, a pressure regulation assembly is required to regulate the air pressure within the isolation chamber 18 to be the same as that within the loading and unloading chamber on its' corresponding opened side. The present embodiment, in order to facilitate the regulation of the air pressure within the isolation chamber 18, needs to control the switching doors on both the front and rear sides of the isolation chamber 18 to be in the closed state before regulating the air pressure, to make the isolation chamber 18 be in the sealed state.

In some embodiments of the present application, the control method may also include: in a process of processing the to-be-processed wafer on the wafer boat within the machining assembly 10: controlling the wafer transfer assembly 12 to transfer to-be-processed wafers in the wafer cassette 13 to the wafer boat 14 that is located within the wafer loading and unloading chamber 11 in an unfilled state; or, controlling the wafer transfer assembly 12 to transfer the processed wafer to the wafer cassette 13 from the wafer boat 14 that is located within the wafer loading and unloading chamber 11 and loaded with the processed wafer, such design ensures that another wafer boat 14 can load and unload the wafers in the wafer loading and unloading chamber 11 during the processing of wafers on the wafer boat 14 in the machining assembly 10, thereby improving the processing efficiency of the wafer processing device.

In addition, it should also be noted that during the process of processing wafers on the wafer boat 14 in the machining assembly 10, another wafer boat 14 is not limited to loading and unloading wafers in the wafer loading and unloading chamber 11, and it is also possible for the wafer boat 14 loaded with unprocessed wafers to wait in the first isolation chamber 18a for entering the wafer loading and unloading chamber 16, or the wafer boat 14 loaded with processed wafers to wait in the second isolation chamber 18b for entering the wafer loading and unloading chamber 16, etc., depending on the specific situation.

Figure 4:
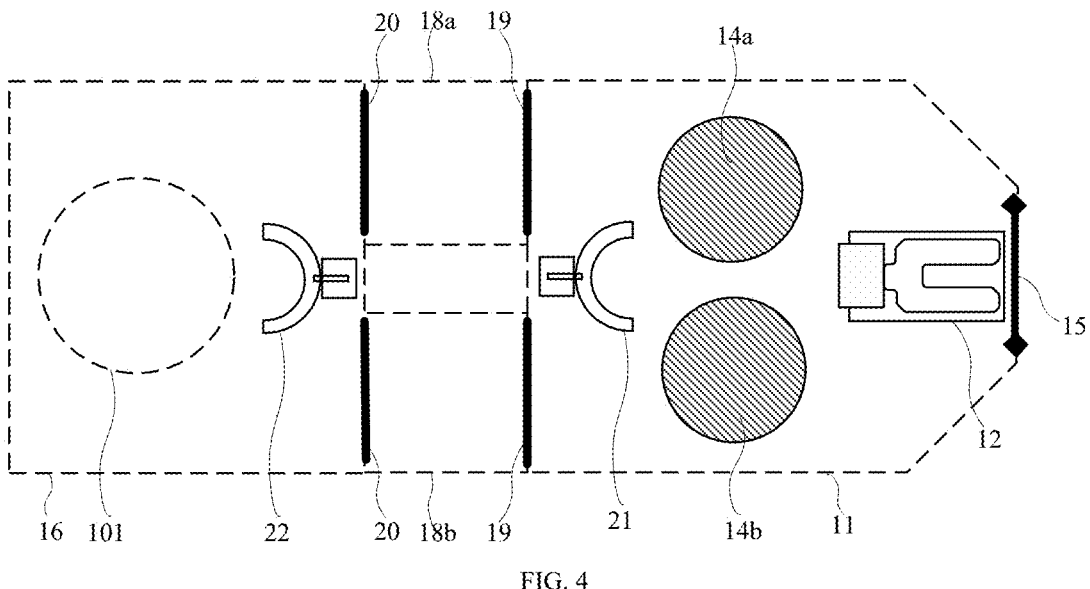
FIGS. 4 to 9 are schematic structural diagrams of the wafer processing device of the present application after different steps are performed, respectively.
Figure 5:
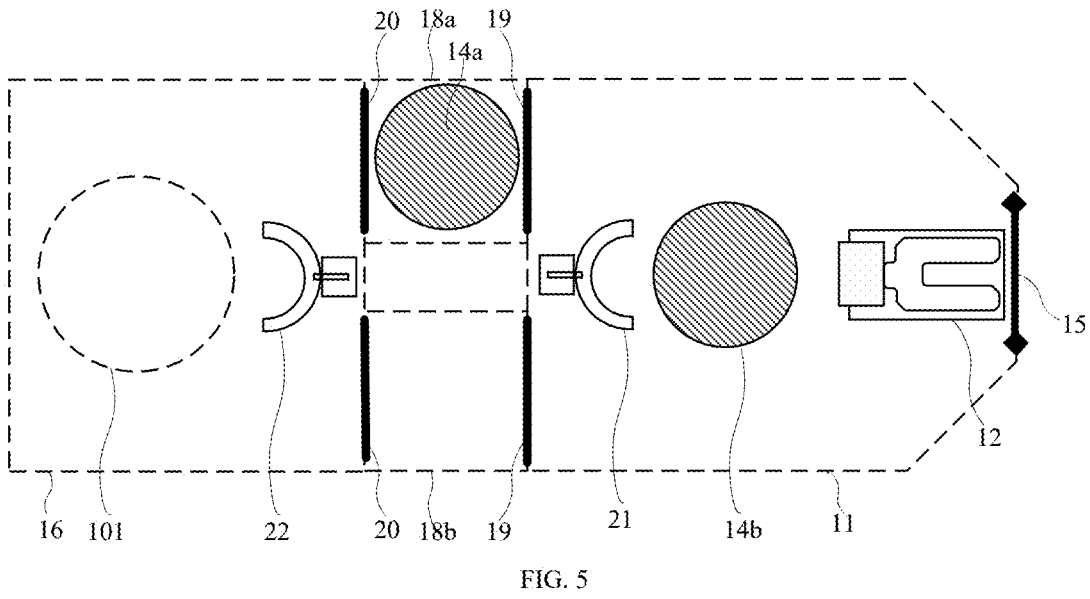
Figure 6:
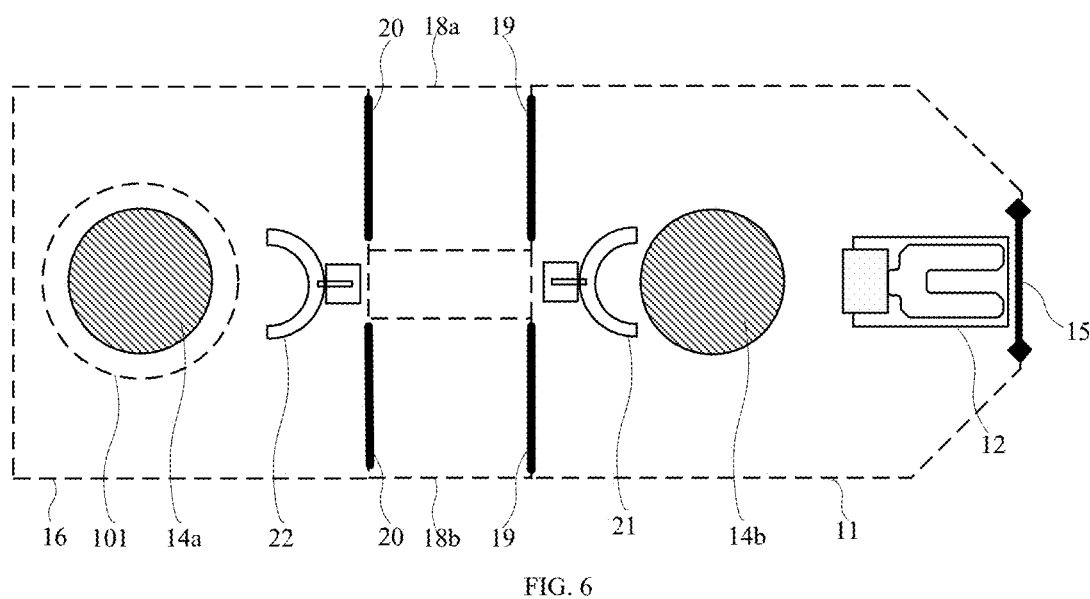
Figure 7:
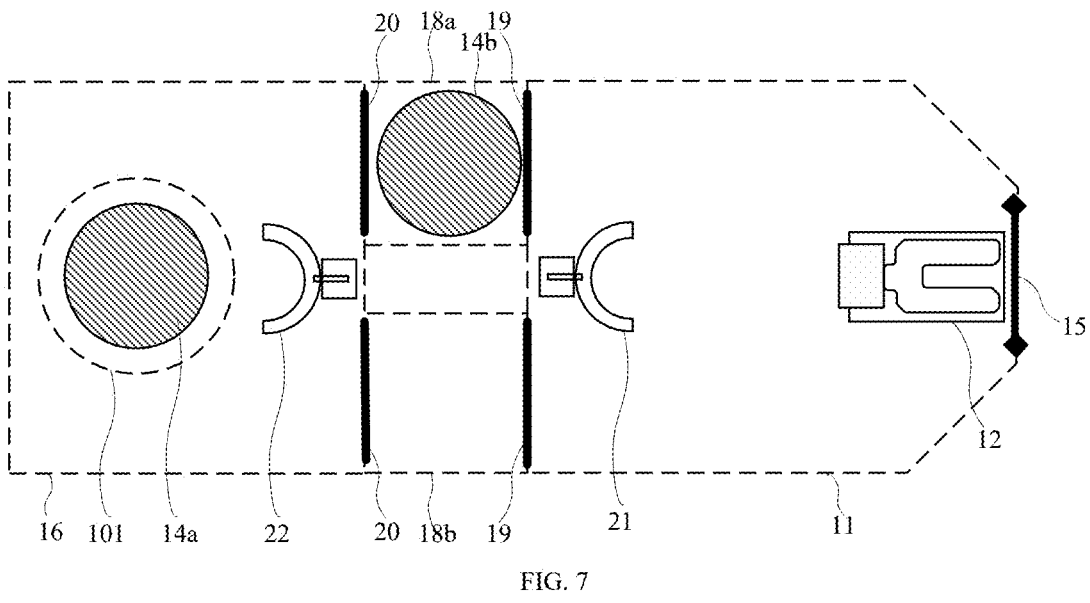
Figure 8:
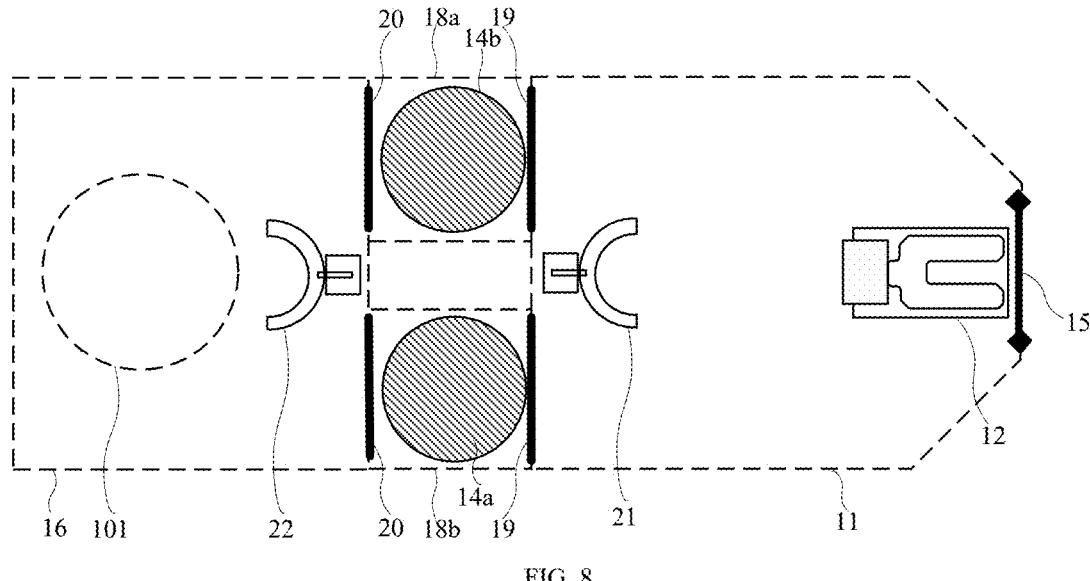

In a specific embodiment of the present application, combining FIGS. 1, 2, and 4 to 9, the wafer processing device includes a machining assembly 10, a wafer boat base 17, and two wafer boats 14, i.e., the first wafer boat 14a and the second wafer boat 14b as an example for illustrating the control method, the control method of the present embodiment may include:

Step S10, at an initial stage, making the first wafer boat 14a and the second wafer boat 14b to be in an unloaded state and to be located in the wafer loading and unloading chamber 11 waiting for loading wafers, as shown with reference to FIG. 4;

Step S11, controlling the robot arm to move the wafer cassette 13 accommodating unprocessed wafers in the temporary storage region to the front-open interface mechanical standard 15;

Step S12, controlling the front-opening interface mechanical standard 15 to open between the wafer cassette 13 and the wafer loading and unloading chamber 11, and controlling the wafer transfer assembly 12 to transfer the unprocessed wafers in the wafer cassette 13 into the first wafer boat 14a first;

Step S13, after the first wafer boat 14a is fully loaded with unprocessed wafers, first controlling the pressure regulation assembly to regulate the air pressure within the first isolation chamber 18a to the air pressure within the wafer loading and unloading chamber 11, and then controlling the front switching door 19 corresponding to the first isolation chamber 18a to open, and then controlling the first transfer robot arm 21 to transfer the first wafer boat 14a loaded with unprocessed wafers to the first isolation chamber 18a, as shown in FIG. 5, and then controlling the front switching door 19 corresponding to the first isolation chamber 18a to close, and then controlling the pressure regulation assembly to reduce the air pressure within the first isolation chamber 18a to the air pressure within the wafer boat loading and unloading chamber 16, and then controlling the rear switching door 20 corresponding to the first isolation chamber 18a to open;

Step S14, after controlling the rear switching door 20 corresponding to the first isolation chamber 18a to open, controlling the second transfer robot arm 22 to transfer the first wafer boat 14a loaded with unprocessed wafers to the wafer boat base 17 within the wafer boat loading and unloading chamber 16, and then controlling the rear switching door 20 corresponding to the first isolation chamber 18a to close;

Step S15, controlling the furnace tube cover 102 to open the machining furnace tube 101, and controlling the lifting assembly 172 of the wafer boat base 17 to drive the base body 171 to rise, to drive the first wafer boat 14a loaded with unprocessed wafers to rise up into the machining furnace tube 101, as shown with reference to FIG. 6;

Step S16, after the first wafer boat 14a loaded with unprocessed wafers is completely sent into the machining furnace tube 101 and the base body 171 of the wafer boat base 17 seals the machining furnace tube 101, processing the wafers on the first wafer boat 14a;

Step S17, in the process of the first wafer boat 14a loaded with unprocessed wafers being transferred step by step from the wafer loading and unloading chamber 11 into the machining furnace tube 101 for processing, the wafer transfer assembly 12 may be controlled to transfer the unprocessed wafers in the wafer cassette 13 into the second wafer boat 14b;

Step S18, after the second wafer boat 14b is fully loaded with unprocessed wafers, first controlling the pressure regulation assembly to regulate the air pressure within the first isolation chamber 18a to the air pressure within the wafer loading and unloading chamber 11, and then controlling the front switching door 19 corresponding to the first isolation chamber 18a to open, and then controlling the first transfer robot arm 21 to transfer the second wafer boat 14b loaded with unprocessed wafers into the first isolation chamber 18a, as shown in FIG. 7, and then controlling the front switching door 19 corresponding to the first isolation chamber 18a to close, and then controlling the pressure regulation assembly to reduce the air pressure within the first isolation chamber 18a to the air pressure within the wafer boat loading and unloading chamber 16;

Step S19, when the wafers on the first wafer boat 14a are machined in the machining furnace tube 101, controlling the wafer boat base 17 to drive the first wafer boat 14a loaded with processed wafers to exit out of the machining furnace tube 101. It should be noted that the process of step S19 may be carried out simultaneously with the process of "controlling the pressure regulation assembly to reduce the air pressure within the first isolation chamber 18a to the air pressure within the wafer boat loading and unloading chamber 16" in step S18, but is not limited to this process, and the exiting of the first wafer boat 14a may be first performed or the reduction of the air pressure within the first isolation chamber 18a may be first performed, and so on;

Step S20, after the first wafer boat 14a loaded with processed wafers is driven by the wafer boat base 17 to completely exit out of the machining furnace tube 101, controlling the rear switching door 20 corresponding to the second isolation chamber 18b to open, and then controlling the second transfer robot arm 22 to transfer the first wafer boat 14a loaded with processed wafers to the second isolation chamber 18b as shown in FIG. 8, and then controlling the rear switching door 20 corresponding to the second isolation chamber 18b to close, and then controlling the pressure regulation assembly to increase the air pressure within the second isolation chamber 18b to the air pressure within the wafer

17

Figure 9:
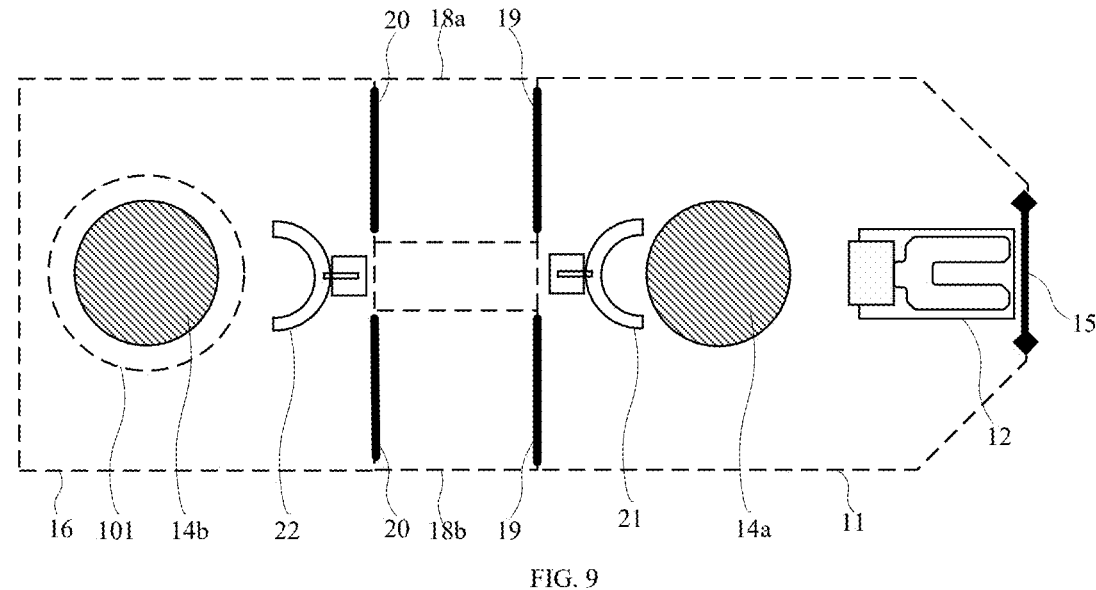

18 loading and unloading chamber 11, and then controlling the front switching door 19 corresponding to the second isolation chamber 18*b* to open, and then controlling the first transfer robot arm 21 to transfer the first wafer boat loaded with processed wafer boat 14*a* from the second isolation chamber 18*b* to the wafer loading and unloading chamber 11, as shown in FIG. 9. It should be understood that before controlling the rear switching door 20 corresponding to the second isolation chamber 18*b* to open in step S20, it is first necessary to regulate the air pressure within the second isolation chamber 18*b* to the air pressure within the wafer loading and unloading chamber 16 by using the pressure regulation assembly, this process may be the same as the process of "controlling the pressure regulation assembly to reduce the air pressure within the first isolation chamber 18*a* to the air pressure within the wafer loading and unloading chamber 16" in step S18, but it is not limited thereto, and the air pressure in the first isolation chamber 18*a* and the second isolation chamber 18*b* may also be regulated separately;

Step S21, after controlling the second transfer robot arm 22 to transfer the first wafer boat 14*a* loaded with processed wafers to the second isolation chamber 18*b*, and controlling the rear switching door 20 corresponding to the second isolation chamber 18*b* close, and then controlling the rear switching door 20 corresponding to the first isolation chamber 18*a* to open, and then controlling the second transfer robot arm 22 to transfer the second wafer boat 14*b* loaded with unprocessed wafers to the wafer boat loading and unloading chamber 16, as shown in FIG. 9, and then controlling the rear switching door 20 corresponding to the first isolation chamber 18*a* to close;

Step S22, in the process of controlling the wafer transfer assembly 12 to transfer the processed wafers on the first wafer boat 14*a* to the interior of the wafer cassette 13, the lifting assembly 172 of the wafer boat base 17 may also be controlled to drive the base body 171 to rise, so as to drive the second wafer boat 14*b* loaded with the unprocessed wafers to rise up to the interior of the machining furnace tube 101 for machining.

It should be understood that after the unloading of the processed wafers on the first wafer boat 14*a* is completed, the second wafer boat 14*b* is still machining inside the machining furnace tube 101, at this time, the unprocessed wafers in the wafer cassette 13 can be transferred to the first wafer boat 14*a* again, and then the above steps are repeated to realize the alternative processing of the first wafer boat 14*a* and the second wafer boat 14*b*.

In addition, it is also noted that the control method of the present embodiment is not limited to the foregoing mentioned contents, as long as it can be ensured that the wafer boat 14 loaded with processed wafers and the wafer boat 14 loaded with unprocessed wafers are not located in the same chamber at the same time.

Embodiments of the present application also provide a wafer processing system, which includes a wafer processing device and a master controller, the specific structure of the wafer processing device can be referred to as described in any of the foregoing embodiments, and will not be repeated herein, and the master controller can be used to realize the control method described in any of the foregoing embodiments, and will not be repeated herein.

In addition, the terms "first", "second", etc. are used only for descriptive purposes and are not to be understood as indicating or implying relative importance or implicitly specifying the number of technical features indicated. Thus, a feature defined with "first", "second" may expressly or implicitly include one or more such features. In the description of the present application, "more than one" means two or more, unless otherwise expressly and specifically limited.

In the description of the present specification, the terms "some embodiments", "exemplarily", etc. means that a specific feature, structure, material, or characteristic described in conjunction with the embodiment or example is included in at least one embodiment or example of the present application. In this specification, schematic expressions of the above terms need not be directed to the same embodiment or example. Moreover, the specific features, structures, materials, or characteristics described may be combined in any one or more embodiments or examples in a suitable manner. Moreover, without contradicting each other, those skilled in the art may combine different embodiments or examples and features of different embodiments or examples described in this specification.

Although embodiments of the present application have been shown and described above, it is understood that the above embodiments are exemplary and should not be construed as a limitation of the present application, and that those skilled in the art may make changes, modifications, substitutions, and variations to the above embodiments within the scope of the present application, and therefore, any changes or modifications made in accordance with the claims of the present application and the specification shall fall within the scope of the present application.

What is claimed is:

1. A wafer processing device, comprising:
a machining region, comprising at least one machining assembly;
a wafer loading and unloading region, comprising a wafer loading and unloading chamber and a wafer transfer assembly provided within the wafer loading and unloading chamber, wherein the wafer transfer assembly is configured to make a to-be-processed wafer within a wafer cassette to be transferred to a wafer boat or to make a processed wafer on the wafer boat to be transferred to the wafer cassette;
a wafer boat loading and unloading region, comprising a wafer boat loading and unloading chamber and a wafer boat base provided within the wafer boat loading and unloading chamber, wherein the wafer boat base is configured to carry the wafer boat and to send the wafer boat into or out of the at least one machining assembly;
an isolation region, located between the wafer boat loading and unloading region and the wafer loading and unloading region, and comprising a plurality of mutually independent isolation chambers, wherein a front switching door is provided between each of the plurality of isolation chambers and the wafer boat loading and unloading chamber, the front switching door is capable of being opened or closed for opening or closing each of the plurality of isolation chambers and the wafer boat loading and unloading chamber, wherein a rear switching door is provided between each of the plurality of isolation chambers and the wafer boat loading and unloading chamber, and is capable of being opened or closed for opening or closing each of the plurality of isolation chambers and the wafer boat loading and unloading chamber; and
at least two wafer boats and a transfer device, wherein the transfer device is configured to transfer the at least two wafer boats between the wafer loading and unloading chamber and an interior of each of the plurality of isolation chambers and the transfer device is further configured to transfer the at least two wafer boats between the wafer boat loading and unloading chamber and each of the plurality of isolation chambers;

wherein the plurality of isolation chambers comprise a first isolation chamber and a second isolation chamber, and the first isolation chamber is configured to accommodate a wafer boat that is transferred from the wafer loading and unloading chamber to an interior of the first isolation chamber and is loaded with the to-be-processed wafer, and the second isolation chamber is configured to accommodate the wafer boat that is transferred from the wafer boat loading and unloading chamber to an interior of the second isolation chamber and is loaded with the processed wafer.

2. The wafer processing device according to claim 1, wherein an air pressure within the wafer boat loading and unloading chamber is less than atmospheric pressure.

3. The wafer processing device according to claim 2, wherein an air pressure within the wafer loading and unloading chamber is greater than the air pressure within the wafer boat loading and unloading chamber.

4. The wafer processing device according to claim 3, wherein the air pressure within the wafer loading and unloading chamber is the atmospheric pressure, or, the air pressure within the wafer loading and unloading chamber is less than the atmospheric pressure.

5. The wafer processing device according to claim 3, wherein the isolation region further comprises a pressure regulation assembly, and the pressure regulation assembly is configured to:

regulate the air pressure within each isolation chamber to be the same as the air pressure within the wafer loading and unloading chamber before controlling the front switching door to open to make the isolation chamber and the wafer loading and unloading chamber be in an open state; and regulate the air pressure within each of the plurality of isolation chambers to be the same as the air pressure within the wafer boat loading and unloading chamber before controlling the rear switching door to open to make each of the plurality of isolation chambers and the wafer boat loading and unloading chamber be in an open state.

6. The wafer processing device according to claim 1, wherein each machining assembly comprises:

a machining furnace tube, provided outside the wafer boat loading and unloading chamber and connected to the wafer boat loading and unloading chamber, wherein the machining furnace tube is capable of providing a working environment for processing a wafer.

7. The wafer processing device according to claim 6, wherein:

the machining furnace tube is a vertical furnace tube, and a tube opening of the machining furnace tube is provided opposite to a top of the wafer boat loading and unloading chamber; and the wafer boat base comprises a base body and a lifting assembly, and an orthographic projection of the tube opening of the machining furnace tube is located within the base body, and the lifting assembly is connected to the base body for driving the base body to carry out lifting and lowering motions for closing or opening the machining furnace tube, to send the wafer boat carried on the base body into or out of the machining furnace tube.

8. The wafer processing device according to claim 7, wherein each machining assembly further comprises a furnace tube cover, the furnace tube cover is provided at a top of the wafer boat loading and unloading chamber and within the wafer boat loading and unloading chamber, and is movable relative to the machining furnace tube to open or close the machining furnace tube;

wherein the furnace tube cover is capable of closing the machining furnace tube when the machining furnace tube is in a state of pending operation.

9. The wafer processing device according to claim 8, wherein the furnace tube cover comprises a cover plate, a slide rail and a connection rod connecting the cover plate to the slide rail, wherein the connection rod also is configured to support the cover plate;

the slide rail is fixed to the top of the wafer boat loading and unloading chamber, an end of the connection rod is fixed to the cover plate, and another end of the connection rod is provided with a slider, and the slider is slidably connected to the slide rail, and the slider is horizontally slidable on the slide rail to drive the cover plate closer to or further from the machining furnace tube, to close or open the machining furnace tube.

10. The wafer processing device according to claim 6, wherein a plurality of machining assemblies are provided, a plurality of wafer boat bases are provided, and the plurality of wafer boat bases correspond one-in-one to the plurality of machining assemblies.

11. The wafer processing device according to claim 1, wherein the transfer device comprises:

a first transfer robot arm, provided in the wafer loading and unloading chamber, wherein the first transfer robot arm is configured to transfer the wafer boat loaded with the to-be-processed wafer in the wafer loading and unloading chamber to the first isolation chamber when the first isolation chamber and the wafer boat loading and unloading chamber are in an open state, and to transfer the wafer boat loaded with the to-be-processed wafer in the second isolation chamber to the wafer loading and unloading chamber when the second isolation chamber and the wafer loading and unloading chamber are in the open state; and a second transfer robot arm, provided in the wafer boat loading and unloading chamber, wherein the second transfer robot arm is configured to transfer the wafer boat loaded with the to-be-processed wafer in the first isolation chamber to the wafer boat loading and unloading chamber when the first isolation chamber and the wafer loading and unloading chamber are in the open state, and to transfer the wafer boat loaded with the to-be-processed wafer in the wafer boat loading and unloading chamber to the second isolation chamber when the second isolation chamber and the wafer boat loading and unloading chamber are in the open state.

12. The wafer processing device according to claim 1, further comprising a temporary storage region for temporarily storing a plurality of wafer cassettes, wherein the wafer loading and unloading region is closer to the temporary storage region than the wafer boat loading and unloading region; and/or the wafer loading and unloading chamber is provided with a front-opening interface mechanical standard that is compatible with the plurality of wafer cassettes, and the front-opening interface mechanical standard is configured to open or close between the plurality of wafer cassettes and the wafer loading and unloading chamber.

13. A control method, applied to the wafer processing device as claimed in claim 1, comprising:

controlling the rear switching door corresponding to the first isolation chamber to open after the transfer device is controlled to transfer the wafer boat loaded with the processed wafer in the wafer boat loading and unloading chamber to the interior of the second isolation chamber, and then controlling the transfer device to transfer the wafer boat loaded with an unprocessed wafer in the first isolation chamber to the wafer boat base in the wafer boat loading and unloading chamber; and controlling the front switching door corresponding to the second isolation chamber to open after the transfer device is controlled to transfer the wafer boat loaded with the unprocessed wafer in the wafer loading and unloading chamber to the interior of the first isolation chamber, and then controlling the transfer device to transfer the wafer boat loaded with the processed wafer in the second isolation chamber to the wafer loading and unloading chamber.

14. The control method according to claim 13, wherein:

after the transfer device is controlled to transfer the wafer boat loaded with the processed wafer in the wafer boat loading and unloading chamber to the interior of the second isolation chamber, and before the rear switching door corresponding to the first isolation chamber is controlled to open, controlling the rear switching door corresponding to the second isolation chamber to be in a closed state; and after the transfer device is controlled to transfer the wafer boat loaded with the to-be-processed wafer in the wafer loading and unloading chamber to the interior of the first isolation chamber, and before the front switching door corresponding to the second isolation chamber is controlled to open, controlling the front switching door corresponding to the first isolation chamber to be in the closed state.

15. The control method according to claim 13, further comprising: in a process of processing the to-be-processed wafer on the wafer boat within each machining assembly, controlling the wafer transfer assembly to transfer the to-be-processed wafer in the wafer cassette to the wafer boat that is located within the wafer loading and unloading chamber and in an unfilled state; or controlling the wafer transfer assembly to transfer the processed wafer to the wafer cassette from the wafer boat that is located within the wafer loading and unloading chamber and loaded with the processed wafer.

16. A wafer processing system, comprising:

the wafer processing device as claimed in claim 1; and a master controller configured to:

control the rear switching door corresponding to the first isolation chamber to open after the transfer device is controlled to transfer the wafer boat loaded with the processed wafer in the wafer boat loading and unloading chamber to the interior of the second isolation chamber, and then control the transfer device to transfer the wafer boat loaded with an unprocessed wafer in the first isolation chamber to the wafer boat base in the wafer boat loading and unloading chamber; and control the front switching door corresponding to the second isolation chamber to open after the transfer device is controlled to transfer the wafer boat loaded with the unprocessed wafer in the wafer loading and unloading chamber to the interior of the first isolation chamber, and then control the transfer device to transfer the wafer boat loaded with the processed wafer in the second isolation chamber to the wafer loading and unloading chamber.

* * * * *